United States Patent
Willer et al.

(10) Patent No.: US 7,087,950 B2
(45) Date of Patent: Aug. 8, 2006

(54) FLASH MEMORY CELL, FLASH MEMORY DEVICE AND MANUFACTURING METHOD THEREOF

(75) Inventors: Josef Willer, Riemerling (DE); Frank Lau, Bad Aibling (DE)

(73) Assignee: Infineon Technologies AG, Munich (DE)

( * ) Notice: Subject to any disclaimer, the term of this patent is extended or adjusted under 35 U.S.C. 154(b) by 25 days.

(21) Appl. No.: 10/835,390

(22) Filed: Apr. 30, 2004

(65) Prior Publication Data

US 2005/0242388 A1 Nov. 3, 2005

(51) Int. Cl.
*H01L 29/76* (2006.01)
*H01L 29/788* (2006.01)

(52) U.S. Cl. ............... 257/314; 257/315; 257/316; 257/318; 257/329; 257/E21.655; 257/E21.41; 257/E21.693; 257/E21.625

(58) Field of Classification Search ........ 257/314–318, 257/329, E21.41, E21.655, E21.693, E21.625
See application file for complete search history.

(56) References Cited

U.S. PATENT DOCUMENTS

| | | | | |
|---|---|---|---|---|
| 5,874,760 | A * | 2/1999 | Burns et al. | 257/315 |
| 6,118,159 | A * | 9/2000 | Willer et al. | 257/390 |
| 6,853,029 | B1 * | 2/2005 | Ichige et al. | 257/316 |
| 6,979,857 | B1 * | 12/2005 | Forbes | 257/314 |
| 2002/0102793 | A1 * | 8/2002 | Wu | 438/257 |
| 2003/0042531 | A1 | 3/2003 | Lee et al. | |
| 2003/0178670 | A1 | 9/2003 | Fried et al. | |
| 2003/0183872 | A1 * | 10/2003 | Miida | 257/315 |
| 2004/0004863 | A1 * | 1/2004 | Wang | 365/199 |
| 2004/0207038 | A1 * | 10/2004 | Hofmann et al. | 257/500 |
| 2005/0006695 | A1 * | 1/2005 | Lee et al. | 257/315 |
| 2005/0180186 | A1 * | 8/2005 | Lutze et al. | 365/53 |
| 2005/0282345 | A1 * | 12/2005 | Mathew et al. | 438/301 |

OTHER PUBLICATIONS

Ichige, M., et al., "A Novel Self-Aligned Shallow Trench Isolation Cell for 90nm 4Gbit NAND Flash EEPROMs," Symposium on VLSI Technology Digest of Technical Papers, 2003, pp. 89-90.

* cited by examiner

*Primary Examiner*—B. William Baumeister
*Assistant Examiner*—Igwe U. Anya
(74) *Attorney, Agent, or Firm*—Slater & Matsil, L.L.P.

(57) ABSTRACT

The present invention relates to a flash memory cell comprising a silicon substrate having an active region comprising a channel region and source-/drain-regions, the active region comprising a projecting portion, which projecting portion at least comprising said channel region; a tunneling dielectric layer formed on the surface of said active region; a floating gate formed on the surface of said tunneling dielectric layer for storing electric charges; an inter-gates coupling dielectric layer formed on the surface of said floating gate, and a control gate formed on the surface of said inter-gates coupling dielectric layer, wherein said floating gate is formed to have a groove-like shape for at least partly encompassing said projecting portion of said active region. This invention further relates to a flash memory device comprising such flash memory cells, as well as a manufacturing method thereof.

31 Claims, 10 Drawing Sheets

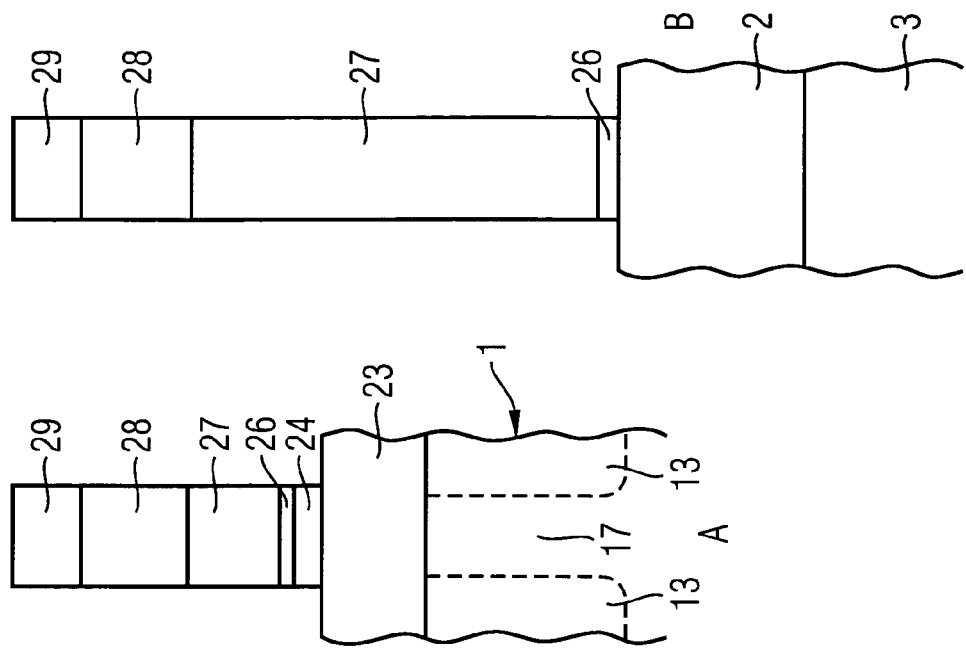
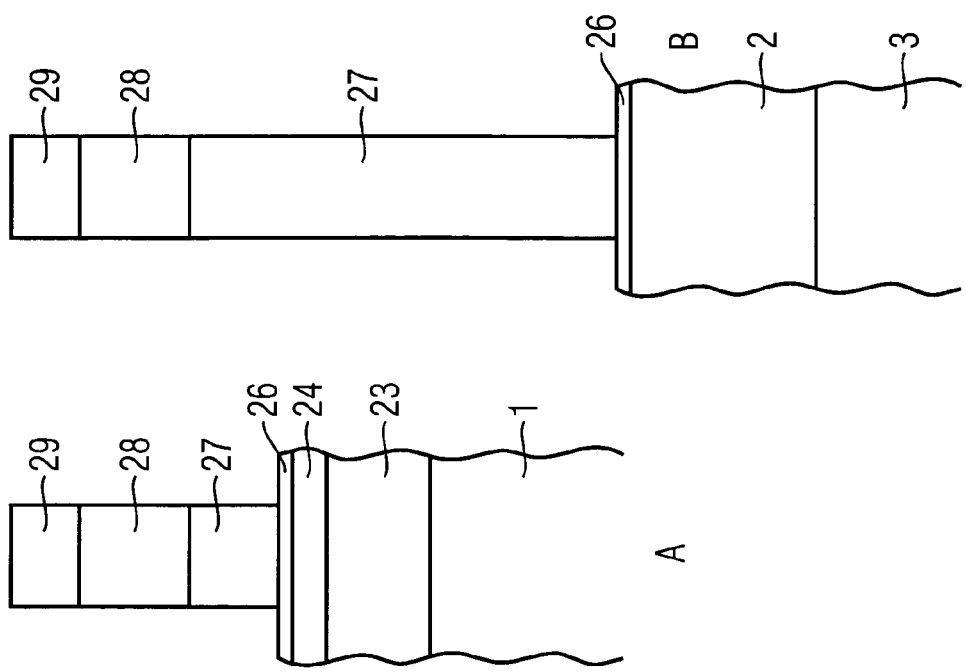

FLASH MEMORY CELL, FLASH MEMORY DEVICE AND MANUFACTURING METHOD THEREOF

TECHNICAL FIELD

This invention is in the field of non-volatile semiconductor memory devices and more particularly relates to a flash memory cell, a flash memory device comprising an array of such flash memory cells, such as a NOR-type flash memory device or a NAND-type flash memory device, and a manufacturing method thereof.

BACKGROUND ART

A non-volatile flash memory device is known to store charges in a floating gate by means of either Fowler-Nordheim tunneling or hot-electron injection through a thin tunneling-oxide layer from a semiconductor substrate for programming operation and to remove or erase charges stored in a floating gate by means of Fowler-Nordheim tunneling through a thin tunneling-oxide layer to a semiconductor substrate or to a control gate for erasing operation. Based on the specific cell structure chosen, flash memory cells may be made up of a stack-gate structure.

A typical stack-gate structure of prior art flash memory cells is shown in FIG. 1A and FIG. 1B. More particularly, FIG. 1A shows a schematic view of high density floating gate flash memory elements forming a NAND-type flash memory array having floating gates self-aligned with shallow trench isolation (see M. Ichige et al., "A novel self-aligned shallow trench isolation cell for 90 nm 4 GBit NAND Flash EEPROMs", 2003 Symposium on VLSI Technology Digest of Technical Papers).

Referring now to FIG. 1A, a plurality of shallow isolating trenches 2 are provided on an integrated circuit substrate 3 to define a plurality of active regions 1. A control gate 4 crosses over the shallow isolation trenches 2 pattern. A floating gate 5 pattern is disposed between the control gate electrode 4 and the active regions 1. As illustrated in FIG. 1A, the flash memory element further includes a tunneling-oxide layer 6 pattern being arranged in between the floating gates 5 and the active regions 1 and an inter-gates dielectric layer 7 being arranged in between the floating gate 5 and the control gate 4. The inter-gates coupling dielectric layer 7 is typically of an oxide-nitride-oxide (ONO) structure and includes first 8, second 9 and third 10 layers of silicon oxide, silicon nitride and silicon oxide, respectively. The flash memory element further includes a metal layer 11 deposited on the control gate 4 and a hardmask layer 12 arranged on the metal layer 11

Referring to FIG. 1B, typical high density floating gate flash memory cells realized in NOR-type structure as sectioned through its source/drain-regions 13 and channel regions 17 are shown. Similar to the arrangement of FIG. 1A, floating gates 5 are placed above silicon substrate 3 having a tunneling oxide layer 6 arranged in between. Control gates 4 and floating gates 5 are separated by inter-gates dielectric layer 7. Bit-line 14 has a plurality of bit-line contacts 15 to contact drains of active regions 13 of the memory cells.

Referring now to FIGS. 5A and 5B, schematic views of a typical NAND-type flash memory array and a typical NOR-type flash memory array, respectively, are shown. FIG. 5A is a top plan view of a NAND-type array having a plurality of memory elements arranged in rows and columns. FIG. 5A shows several NAND-strings, each of which comprises a plurality of flash memory elements. Each NAND-string is respectively connected to one bit line $BL_k$ defining a column, and, in each NAND-string between a bit line contact 16 and a common ground line CG, a plurality of flash memory cells and two select transistors are connected in series. A plurality of word lines $WL_k$ and two selection transistor lines $SG_1$, $SG_2$ defining rows are crossing the bit lines, each of which word lines are connected to control gate terminals of the memory elements of a row, while selection transistor lines are connected to the gates of corresponding selection transistors. Between adjacent bit lines, bit line pitch F may be identified.

FIG. 4B is a top plan view of a NOR-type array having a plurality of memory elements arranged in rows and columns. Contrary to the NAND-type array of FIG. 4A, each bit line $BL_k$ is connected to each flash memory cell of a column, and, as with the FIG. 4A NAND-type array, each word line $WL_k$ is connected to each control gate terminal of a row. Between adjacent bit lines, bit line pitch F may be identified.

Recently, and especially in view of modern portable equipment as MP3-players and digital still cameras, the demand of low-cost and high-density mass storage flash memories has increased dramatically. Therefore, one of the most important issues for low-cost and high-density mass storage flash memories is a reduction of the memory cell size. However, in down-scaling flash memories a lot of problems arise, such as pattern nonuniformity and narrow process margins. Also, parasitic coupling noise increases, which may especially cause severe problems relating to adjacent floating gates in NAND-type memory cell arrays. Moreover, since tunneling-oxide layer may not be scaled down markedly in view of the fact that such scaling down is detrimental to programming and retention characteristic of the memory cell, reducing of channel lengths may also lead to an increase in the so-called short channel effects, which, however, should be avoided in any case. Otherwise, especially in NAND-type memory cell arrays having a plurality of memory cells connected in a serial array, reducing of channel width may lead to a decrease of the sense current through the memory cells, for which reason, signal-to-noise-ratio is deteriorated. The latter phenomenon is the reason why multi-level NAND-type memory cell arrays actually are realized to have 16 memory cells per string in a maximum.

It is well-known to improve scaling down characteristic, and more particularly, to increase sense current through miniaturised memory cells, in realizing the memory cells as so-called FinFET-memory cells (see for example U.S. patent application 2003/0042531 to Lee et al.). In such FinFET memory cell a first oxide film is formed on a surface of a silicon substrate and a fin active area is vertically formed on the first oxide film with a narrow width. On top and at both sides of the fin active area a gate tunneling oxide film is formed. Further a floating electrode is formed on the surfaces of the gate tunneling oxide film and the first oxide film for storing electric charges. Further, an inter-gates oxide film is formed on the surface of the floating electrode and a control electrode is formed on the surface of the inter-gates oxide film. While such FinFET-memory cells may actually succeed in enhancing signal-to-noise ratio, they, however, are usually not suitable for application in a high-density mass storage array due to a too large-sized floating gate.

Other solutions especially for overcoming the above-identified problem of reducing signal-to-noise ratio (see for example U.S. patent application 2003/0178670 to Fried et al.) comprise floating gates to be splitted in two parts by specific manufacturing methods, which, however, because of unavoidably occurring process variations may lead to a unsymmetric programming effect and erasing effect, respectively.

Furthermore, convenient manufacturing methods as disclosed in the above-cited documents may not lead to a high-dense architecture of mass storage flash memory devices.

SUMMARY

In view of the above, it is a first object of the invention to provide non-volatile flash memory cells allowing a very high dense integration of memory cells, which are qualified to produce mass storage flash memories of 4 GBit and higher, which are especially capable of reducing parasitic coupling noise of adjacent floating gates and of reducing short channel effects, and which are capable of enhancing signal-to-noise ratio of the sense current.

A second object of the invention is to provide a method for manufacturing a non-volatile flash memory device comprising a plurality of flash memory cells according to the invention, having a STI (shallow trench isolation)-structure, in which active regions of adjacent memory cells are isolated by shallow isolation trenches.

DISCLOSURE OF THE INVENTION

The first object of the invention can be attained by a flash memory cell, which comprises a silicon substrate having an active region comprising a channel region and source-/drain-regions, wherein the active region has a projecting portion, which projecting portion at least comprises said channel region. On the surface of said active region a tunneling dielectric layer, which may be an oxide layer or a nitrided oxide layer, is at least partly formed, and a floating gate is formed on the surface of said tunneling dielectric layer for storing electric charges. An inter-gates dielectric coupling layer, which may be an oxide layer or a nitrided oxide layer, is formed on the surface of said floating gate and a control electrode is formed on the surface of said intergates dielectric coupling layer. According to the invention, said floating gate is formed to have a groove-like shape for at least partly encompassing said projecting portion of said active region. In other words, said projecting portion of said active region dips into said groove-like floating gate, having said tunneling dielectric layer in between, such that said floating gate is at least partly surrounding said projecting portion on top and at both sides thereof.

With the above construction it is possible to enlarge coupling areas between control and floating gates relating to the area of the tunneling dielectric layer surrounding the active area, as compared to the convenient planar case being shown in FIGS. 1A and 1B. The sense current is relatively high due to the floating gate surrounding the active region on top and at both sides thereof, thus enabling a relatively high signal-to-noise ratio. The width of transistors is not limited by the minimum width of structures, which may be reached by optical (UV) lithographic methods and presently typically amounts to about 100 Nanometers, or accordingly reduced floating gate interference. For that reason, a good scaling characteristic is realized. Also, short-channel effects can effectively be reduced in spite of having a relatively thick tunneling dielectric layer. Further, contrary to convenient flash memory cells, very thin metallic floating gates may be used, and furthermore, in contrast to SOI-based FinFET memory cells, the transistor-body advantageously is coupled to the silicon substrate. Tunneling of electrons through said tunneling dielectric layer may advantageously be enabled solely at one or both areas of said projecting portion of said active region and simultaneously may not enabled at a top area thereof. In that case, width of tunneling dielectric layer between floating gate and top of projecting portion of said active region is appropriately chosen.

According to the invention, the projection portion may at least partly dip into the groove-like floating gate having a tunneling dielectric layer in between. It, however, is preferred, that the projecting portion essentially entirely on its full height dips into the groove-like floating gate in order to realize a maximum sense current on account of a given design.

According to a preferred embodiment of the invention, the flash memory cell is designed to have a projecting portion of said active region to have a width, which at most amounts to 50 nm, more preferred is in the range of from 5 nm to 50 nm, and especially preferred is in the range of from 10 nm to 30 nm. In general, and especially in the former case, a height of the projecting portion may amount to 100 nm at a maximum, preferably lies in the range of from 30 nm to 100 nm, and can for instance be chosen to be about 45 nm. Generally, specifically chosen design of a width and a height of the projecting portion of the active region depends on a trade-off of sense current and parasitic coupling noise of adjacent floating gates, which will also enlarge in case sense current is enlarged in raising facing areas of floating gates and projecting portions of active regions.

In another preferred embodiment of the invention, the groove-like floating electrode is formed to have a U-channel-like shape, which then may correspond to a projecting portion of said active region to have a rail-like shape.

The inter-gates dielectric coupling layer preferably is comprised of a silicon oxide film, a silicon nitride film and an silicon oxide film, which conveniently is designated an ONO-structure.

The floating gate material may preferably be selected from the group consisting of n-doped silicon, p-doped silicon, undoped silicon, Ge and an inert metallic material, such as TiN, TaN, WN, Ir, IrO, Ru, RuO and Wsi, and combinations thereof, such as Silicon/Ge. According to the invention, and in contrast to convenient flash memory cells, it is possible to use very thin metallic floating gate electrodes, too.

According to the invention, it is preferred that coupling areas are typically bigger as in the convenient case. More specifically, coupling area between said control gate and said floating gate is about 3 times as large as coupling area between said floating gate and said active region. In general this condition is met, in case a coupling ratio at a minimum amounts to 0,6. Especially in that case, however, not limited thereto, an equivalent thickness of said inter-gates coupling dielectric layer is about 2 times as large as a thickness of said tunneling dielectric layer. The thickness of said tunneling dielectric may be chosen to be about 7 nm.

The present invention also concerns a flash memory device comprising an array of programmable and erasable memory cells as above described, which memory cells, as conveniently, are arranged in columns and rows forming a matrix arrangement, and being contacted to a plurality of bit lines and word lines.

Such flash memory device preferably is of a NAND-type structure, which comprises a plurality of bit lines and a plurality of memory cells connected to the bit lines and forming NAND cell blocks. Each of the NAND cell blocks of a column typically has a series array of flash memory cells (for example 8, 16 or 32 memory cells) connected at a first node thereof to a corresponding bit line associated therewith and connected at a second node thereof to a silicon substrate. Further, parallel word lines crossing the bit lines are provided, each of which is coupled to the floating gates of one of said flash memory cells of a row.

Such flash memory device also preferably is of a NOR-type structure, which comprises a plurality of bit lines and a plurality of memory cells connected to said bit lines and forming NOR cell blocks. Each of such NOR cell blocks, contrary to the NAND-type structure, has only one flash memory cell connected at a first node thereof to a corresponding bit line associated therewith and connected at a second node thereof to said substrate. Also, parallel word lines are provided, each of which is coupled to the floating gates of one of the flash memory cells.

According to an advantageous embodiment of the invention, the flash memory device, which especially is of a NAND-type structure and of a NOR-type structure, respectively, is chosen to have an adress-line pitch, i.e. bit line pitch and/or word line pitch, of at most 150 nm, and more preferably may have a adress-line half pitch in the range of from 40 to 70 nm. Such small adress line pitch seems to be a necessary precondition to realize high-density mass storage flash EEPROMs in the order of 4 Gbit and even higher.

Recently, as for instance is disclosed in the above-referenced document of Ichige et al., self-aligned STI (shallow trench isolation) technology has been reported to be effectively used in reduced memory cell size production in order to realize highly integrated flash memory devices. Moreover, STI-technology may provide a reduced number of fabrication steps during manufacture of the integrated circuit device, thus requiring low fabrication costs and offering high reliability.

For that reason, especially to realize low-sized adress line pitch flash memory devices, flash memory cells may most preferably have a STI (shallow trench isolation) structure, in which active regions of adjacent flash memory cells are isolated from each other by shallow trenches filled with isolating material.

The second object of the invention can be attained by a manufacturing method for a flash memory device having above-explained STI-structure using STI-technology, which comprises the following steps, which may not necessarily be effected in a successive order: providing a silicon substrate to start with fabrication of a STI-trench flash memory device; growing of a pad oxide layer on a surface of the silicon substrate, which pad oxide layer typically may have a layer thickness of about 20 nm, which is considered to be thicker than in prior art manufacturing steps; depositing of a pad nitride layer on the surface of said pad oxide layer; implanting of wells to produce active regions; patterning of STI-trenches by lithography; etching of STI-trenches, which may be effected by RIE (reactive ion etching); growing of a liner for lining of STI-trenches in order to regenerate etch-damaged silicon surface, and depositing of a filling material for filling of STI-trenches; planarization of the filling material, such as by chemical/mechanical polishing; etching back of said filling material to form recesses in said STI-trenches, which may be effected by RIE using the pad nitride layer as a mask; stripping-off of said pad nitride layer; reducing of width of said active regions; growing of a tunneling dielectric layer, which may be an oxide layer and/or a nitrided oxide layer; generating of floating gates; generating an inter-gates coupling dielectric layer, which typically is of an ONO-structure; depositing of a control gate layer; patterning of said control gate layer by lithography; etching of said control gate layer, especially be means of RIE, while taking advantage of high selectivity to oxide to create word lines; implanting of source-/drain junctions; etching of the inter-gates coupling dielectric layer, which may be effected wet or isotropic; etching of the floating gate layer to interrupt the floating gate layer, which may be effected wet or isotropic; depositing of a dielectric layer, which may consist of an oxide or other inter-layer dielectric material, to at least partly fill the gaps between word lines and to encapsulate said floating gates.

Here, all washing and cleanig steps, which anyway are obvious to those skilled in the art, have been omitted for the sake of clarity.

According to a preferred embodiment of the inventive process, reducing of width of said active regions is effected by an etching of said active regions. It also is preferred to effect a reduction in width of active regions by a growing of a sacrificial thermal oxide layer in order to consume silicon in the thermal oxidation process, followed by a removal of said sacrificial thermal oxide layer. It may also be preferrable to effect a "pull-back"-etching of the pad nitride layer.

According to another preferred embodiment of the invention, said generating of an inter-gates coupling dielectric layer comprises the steps of growing of a bottom thermal oxide layer; depositing of a nitride layer by means of LPCVD (low pressure chemical vapour deposition) and growing of a top oxide layer by wet oxidation, especially steam oxidation, of said nitride layer. It then may be preferrable to deposit at least a part of said top oxide layer by means of HT-oxidation (HTO) or by atomic layer deposition.

According to another preferred embodiment of the invention, after said depositing of a control gate layer a metal layer may be deposited. It also may be preferrable that after said depositing of a metal layer a hardmask layer is deposited.

Also, said isolation layer may be planarized, which for example is done by a chemical-mechanical polishing.

Said generation of floating gates may preferably comprise a deposition of a floating gate layer, which then is followed by a removal of bottom coverage of said floating gate layer at said filled STI-trenches. Deposition of the floating gate layer may be effected by utilizing a non-conformal coverage method, such as a sputtering technique; alternatively deposition of the floating gate layer may be effected by utilizing a conformal coverage method, such as a CVD (chemical vapour deposition) technique.

According to the invention, it may be highly preferable, that before said step of removal of bottom coverage of said floating gate layer at said filled trenches a mask layer to prevent etching of the floating gate layer is deposited on top and at both sides of the floating gate layer. In that case, after the depositing of a floating gate layer in utilizing a conformal coverage method, said depositing of a mask layer and said etching of said floating gate layer preferably comprises the following steps: depositing of a thin nitride liner, coating of wafer with an organic layer (resist); etching back of said organic layer to create recesses in STI-trenches; removal of said thin nitride liner, where exposed to etch chemistry; removal of organic layer; growing of etch mask, especially an oxide mask, on uncovered surface; removal of the thin nitride liner, where exposed to etch chemistry; etching of the floating gate layer to interrupt floating gate layer, by means of a convenient etching technique, such as RIE and removal of the etch mask.

Other and further objects, features and advantages of the invention will appear more fully from the following description.

BRIEF DESCRIPTION OF THE DRAWINGS

The accompanying drawings, which are incorporated in and constitute a part of the specification, illustrate presently preferred embodiments of the invention, and together with the general description given above and the detailed description given below, serve to explain the principles of the invention.

DETAILED DESCRIPTION OF THE PREFERRED EMBODIMENTS

Embodiments of the present invention will be described in detail below with reference to the accompanying drawings, where like designations denote like elements.

Figure 1A:
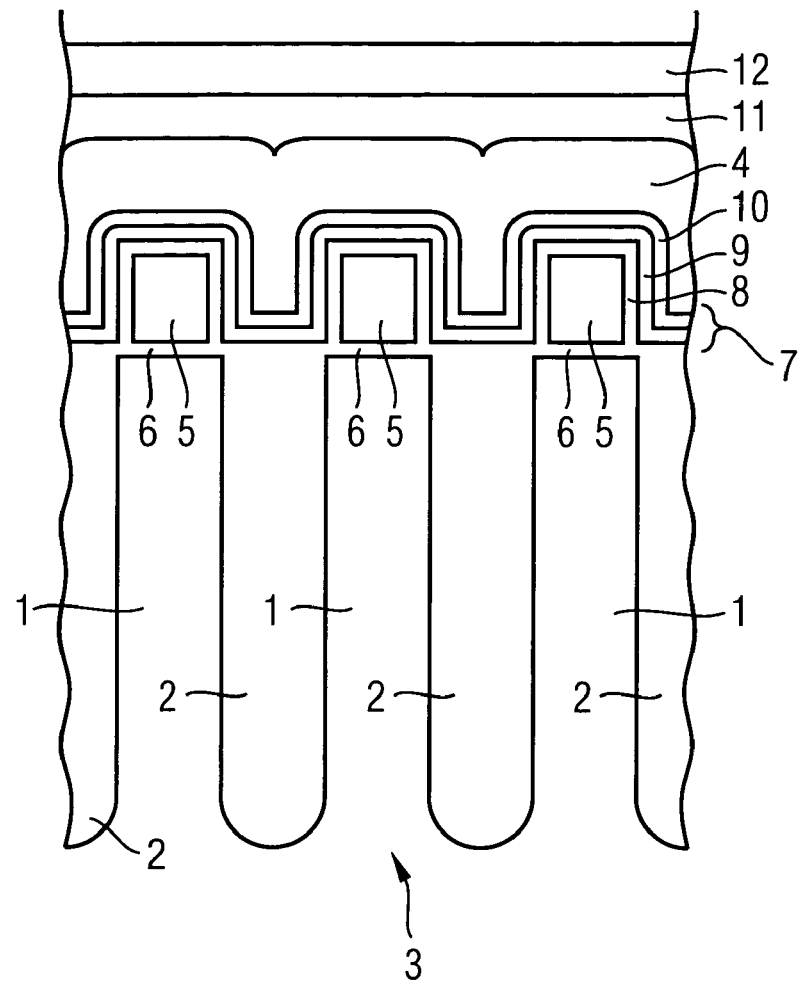
FIGS. 1A and 1B are schematic cross-sectional views showing prior art high-density flash memory cells being of NAND-type and NOR-type structure, respectively.
Figure 1B:
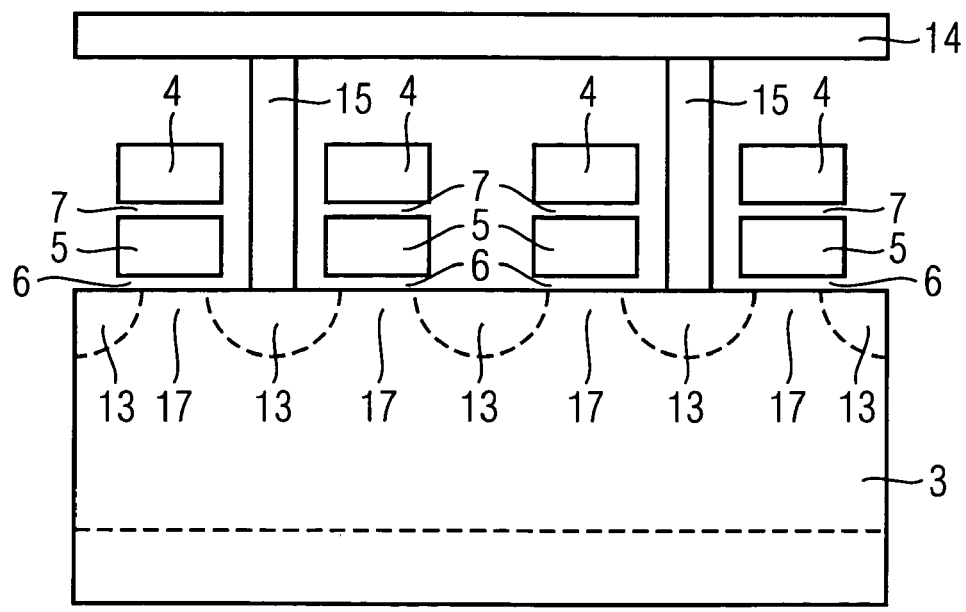
Figure 5A:
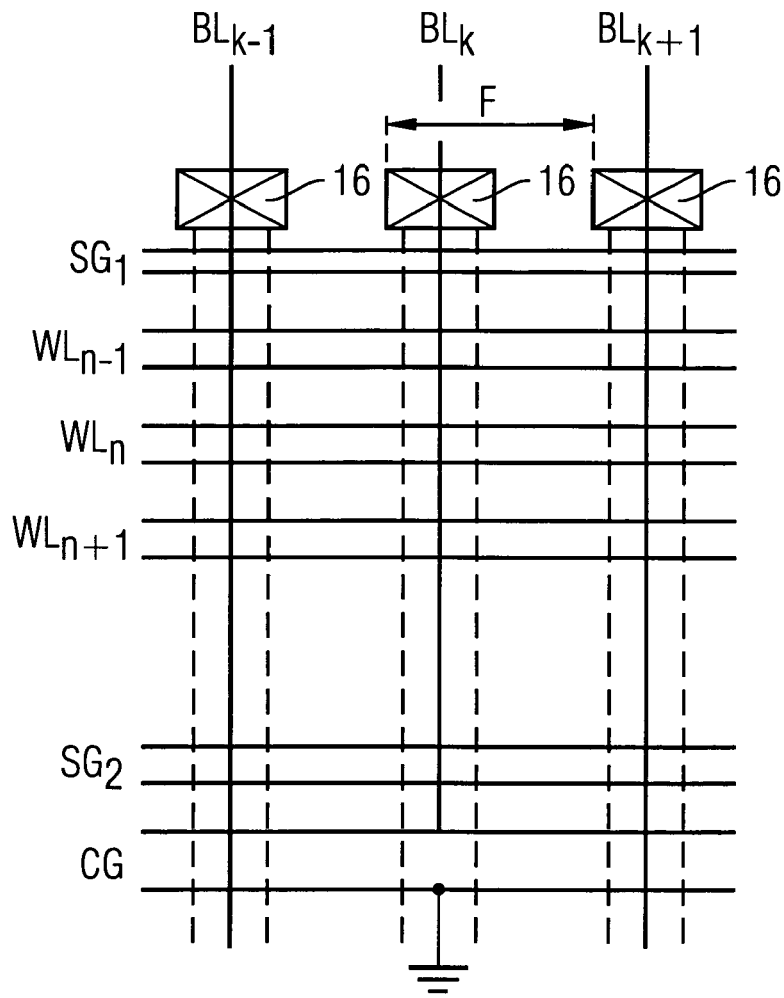
FIGS. 5A and 5B are schematic top plan views showing an array of flash memory cells having NAND-type structure and NOR-type structure, respectively.
Figure 5B:
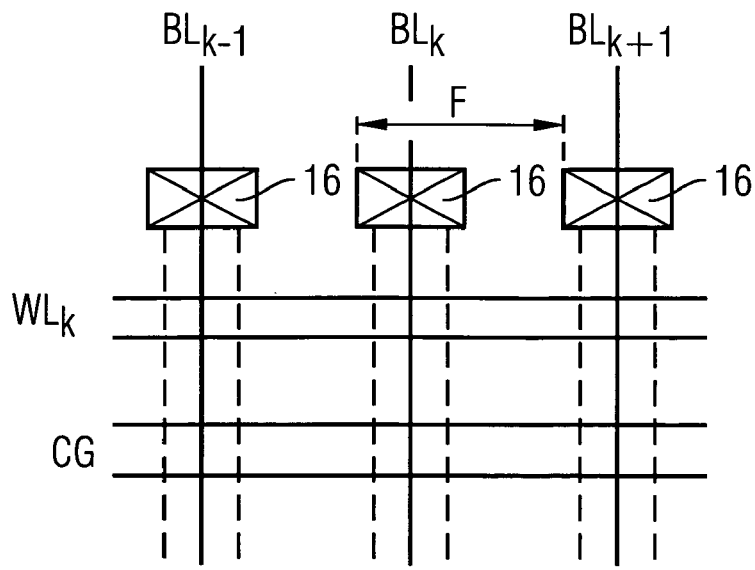

FIGS. 1A and 1B are schematic cross-sectional views showing prior art high-density flash memory cells being of NAND-type and NOR-type structure, respectively. FIGS. 5A and 5B are schematic top plan views showing an array of flash memory cells having NAND-type structure and NOR-type structure, respectively. These figures have already been described in the introductory portion, for which reason an explanation may be omitted to avoid unnecessary repetitions.

Figure 2A:
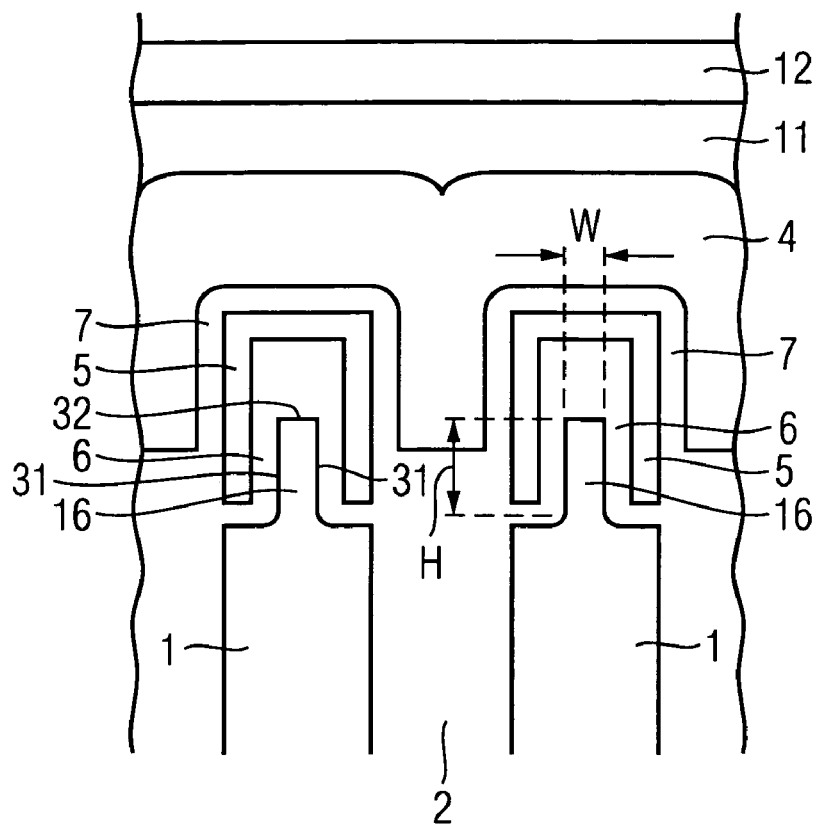
FIGS. 2A and 2B are schematic cross-sectional views showing an embodiment of high-density flash memory cells being of NAND-type structure according to the invention.
Figure 2B:
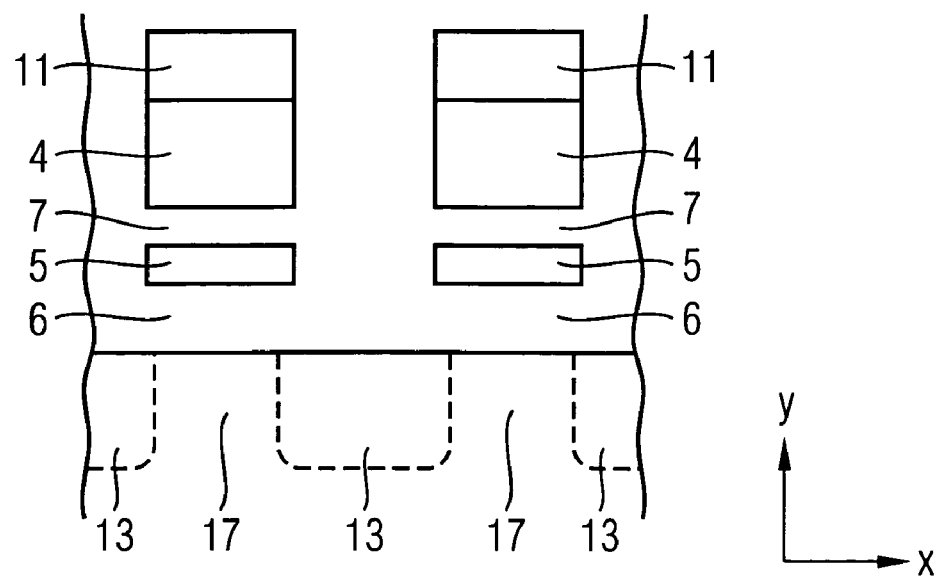

Referring now to FIGS. 2A and 2B, schematic cross-sectional views showing a preferred embodiment of high-density flash memory cells being of NAND-type structure according to the invention are illustrated. FIG. 2A shows a cross-sectional view along the word line, which is identified by control gate 4, whereas FIG. 2B shows a cross-sectional view along the bit line. As can be seen from that figures, on an integrated circuit substrate a plurality of shallow isolating trenches 2 are provided to define a plurality of active regions 1. Active regions 1 include source/drain-regions 13 and channel regions 17. Control gate 4 crosses over the shallow isolation trenches 2 and floating gate 5 pattern is disposed between the control gate 4 and the active regions 1. The flash memory cells further include a tunneling dielectric layer 6 being arranged in between the floating gates 5 and the active regions 1 and an inter-gates coupling dielectric layer 7 being arranged in between the floating gate 5 and the control gate 4. The inter-gates coupling dielectric layer 7 is typically of an oxide-nitride-oxide (ONO) structure and includes first 8, second 9 and third 10 layers of silicon oxide, silicon nitride and silicon oxide, respectively. The flash memory element further includes a metal layer 11 deposited on the control gate 4. The metal layer (28) is made of a metal, which, for example, is selected from the group which consists of WSi, WN, W, and combinations therefrom, especially WN/W, and a hardmask layer 12 is arranged on the metal layer 11. As is a characteristic feature of present invention, each of said active regions 1 comprises a projecting portion 16, which projecting portion 16 at least includes said channel region 17. In the embodiment of FIG. 2A the projecting portion 16 is formed to have a rail-like shape, which in its cross-sectional view is rectangular in shape. As is a further characteristic feature of the present invention, each of the floating gate 5 is formed to have a groove-like shape for at least partly surrounding the projecting portion 16 of the active region 1 associated therewith. In the embodiment of FIG. 2A the floating gate 5 is formed to have a cross-sectional U-like shape. As can be seen form FIG. 2A, each U-like floating gate 5 surrounds its associated projecting portion 16 on top and essentially in full length at both sides thereof in order to gain a maximum sense current. Each projecting portion 16 is chosen to have a width extending in X-direction of about 15 nm and a heigth extending in Y-direction of about 45 nm. Further, each floating electrode 5 is chosen to be n-doped silicon. Further, said tunneling dielectric layer 6 is an oxide layer.

Tunneling of electrons through said tunneling dielectric layer 6 is enabled at both side areas 31 of said projecting portion 16 of said active region 1 and is not enabled at a top area 32 of said projecting portion 16 of said active region 1. The coupling area between said control gate 4 and said floating gate 5 is about 3 times as large as a coupling area between said floating gate 5 and said active region 1. Simultaneously, a thickness of said inter-gates coupling dielectric layer 7, which amounts to about 15 nm, is about 2 times as large as a thickness of said tunneling dielectric layer 6.

Referring now to FIGS. 3A through 3I, in which schematic cross-sectional views for illustrating a first embodiment of a manufacturing method for producing high-density flash memory cells of FIGS. 2A and 2B are shown.

Figure 3A:
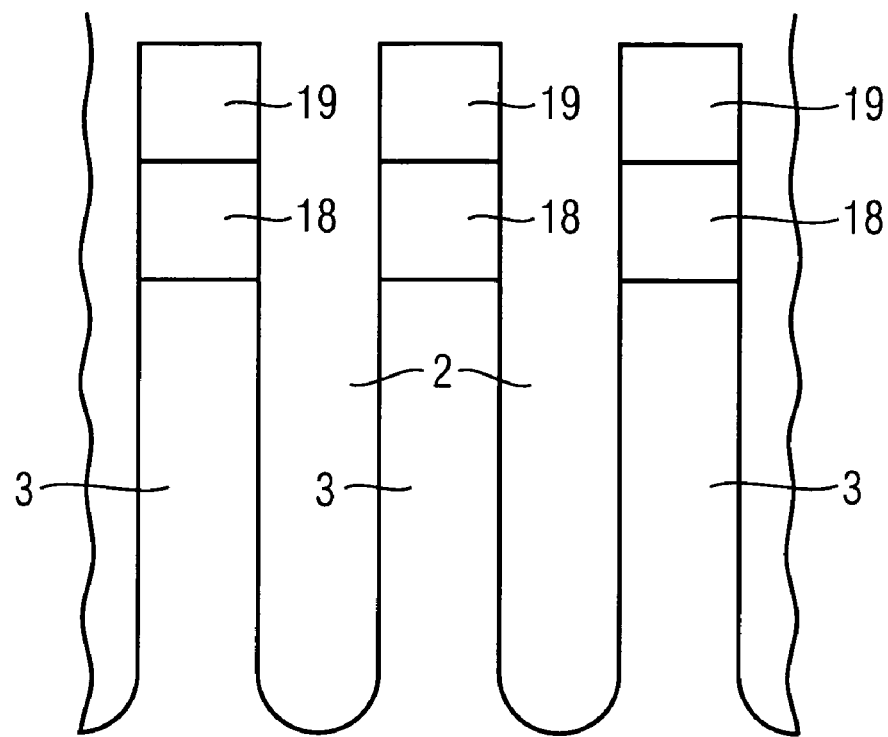
FIGS. 3A trough 3I are schematic cross-sectional views to illustrate an embodiment of a manufacturing method for producing high-density flash memory cells of FIGS. 2A and 2B.

As can be seen from FIG. 3A, which is a cross-secional view along a word line, a silicon substrate 3 is provided to start with fabrication of a STI-trench flash memory device. On the surface of the silicon substrate 3, first a pad oxide layer 18 is grown, which may have a layer thickness of about 20 nm, which is considered to be thicker than in prior art manufacturing steps. After growing the pad oxide layer 18, a pad nitride layer 19 is deposited on the surface of the said pad oxide layer. Then, wells are implanted to produce active regions (not shown in FIG. 3A), which is followed by a patterning of STI-trenches by means of lithography and etching of STI-trenches, which may be effected by RIE (reactive ion etching). FIG. 3A shows a situation after having etched STI-trenches.

Figure 3B:
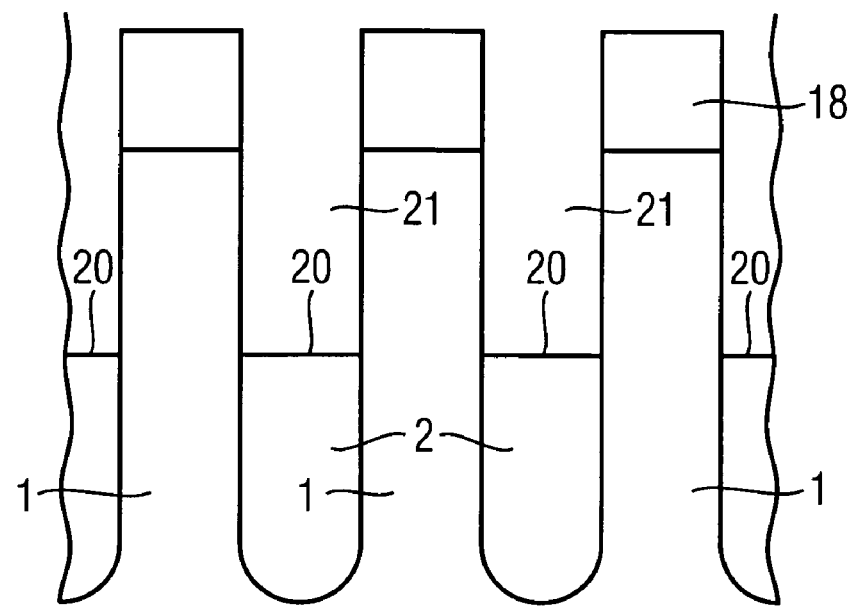

Referring now to FIG. 3B, first an oxide liner (not shown) for lining of STI-trenches is grown, then an oxide isolation layer 20 is deposited to fill STI-trenches 2. Oxide isolation layer 20 then is planarized by chemical/mechanical polishing and back-etched by RIE to create recesses 21 in STI-trenches 2. Also, said pad nitride layer 19 is stripped off. FIG. 3B shows a situation after having stripped off pad nitride layer 19.

Figure 3C:
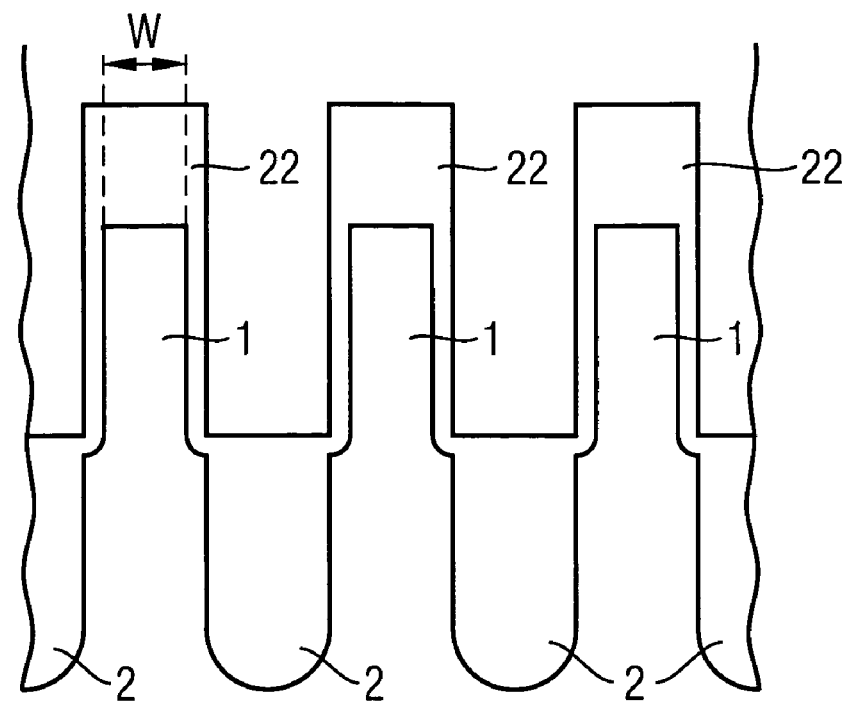
Figure 3D:
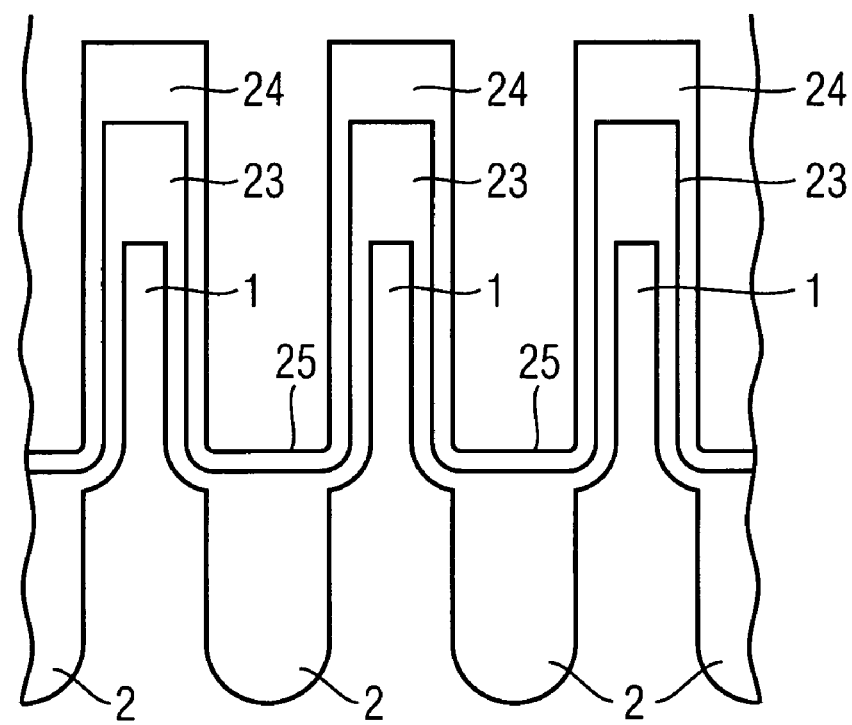

Referring now to FIGS. 3C and 3D, a sacrificial thermal oxide layer 22 is grown in order to minimize etch damage and to reduce width of the active regions 1 by consuming silicon during thermal oxidation. Then, the sacrificial thermal oxide layer 22 is removed, which can be effected wet-chemically. After this, a tunneling oxide layer 23 is grown, which then contains portions of previously grown pad oxide. Then, a floating gate layer 24 is deposited onto the surface of the tunneling oxide layer in using convenient CVD-techniques and in utilizing reduced step coverage. For that, deposition characteristics have to be tuned to deviate to a certain extent from being ideally conformal. In depositing floating gate layer 24, a thin bottom coverage 25 will be formed on trenches 2, which is thinner than the floating gate layer 24 deposited on top of the active regions 1. FIG. 3D shows a situation after having deposited floating gate layer 24.

Figure 3E:
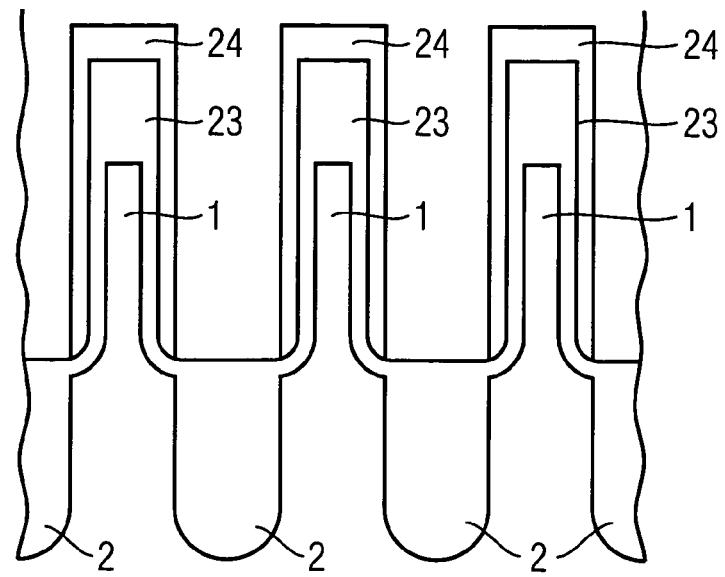
Figure 3F:
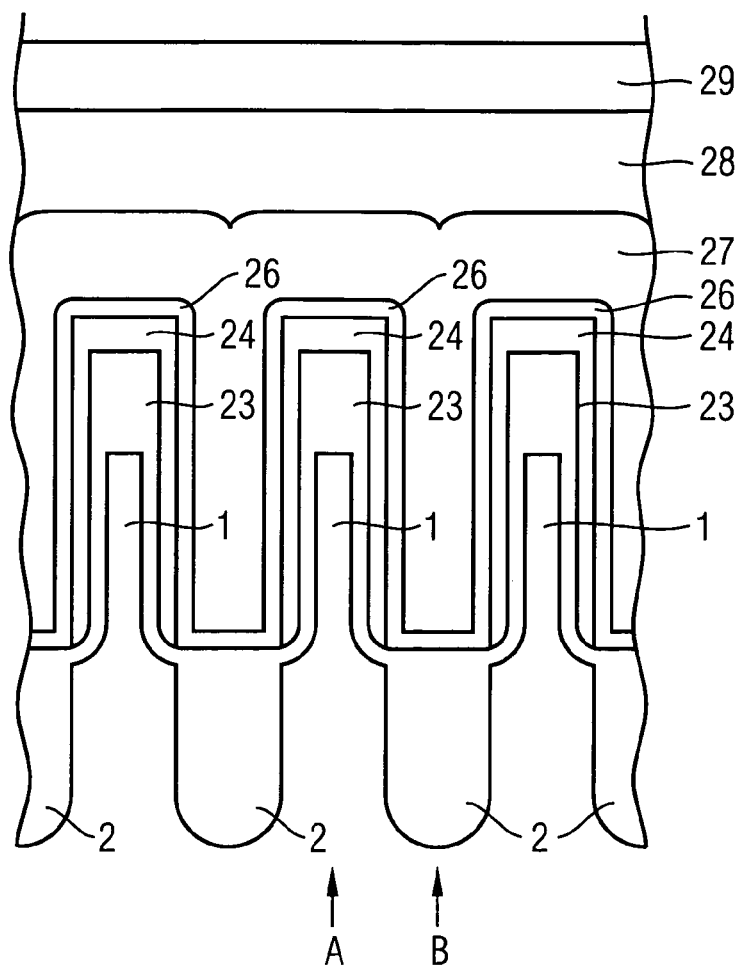

Referring to FIGS. 3E and 3F, thin bottom coverage 25 of said floating gate layer 24 at filled STI-trenches 2 is removed in using RIE with anisotropic etching rate. Since, the bottom coverage 25 is thinner than the floating gate layer 24 on top of the active regions 1, bottom coverage 25 can be removed selectively. Then, an inter-gates coupling dielectric layer 26, which typically is of an ONO-structure is deposited. After that, a control gate layer 27 is deposited and a metal layer 28 is deposited on the surface of the control gate layer 27. On the surface of the metal layer 28 a hardmask 29 is deposited. FIG. 3F shows a situation after having deposited hard mask 29.

Figure 3I:
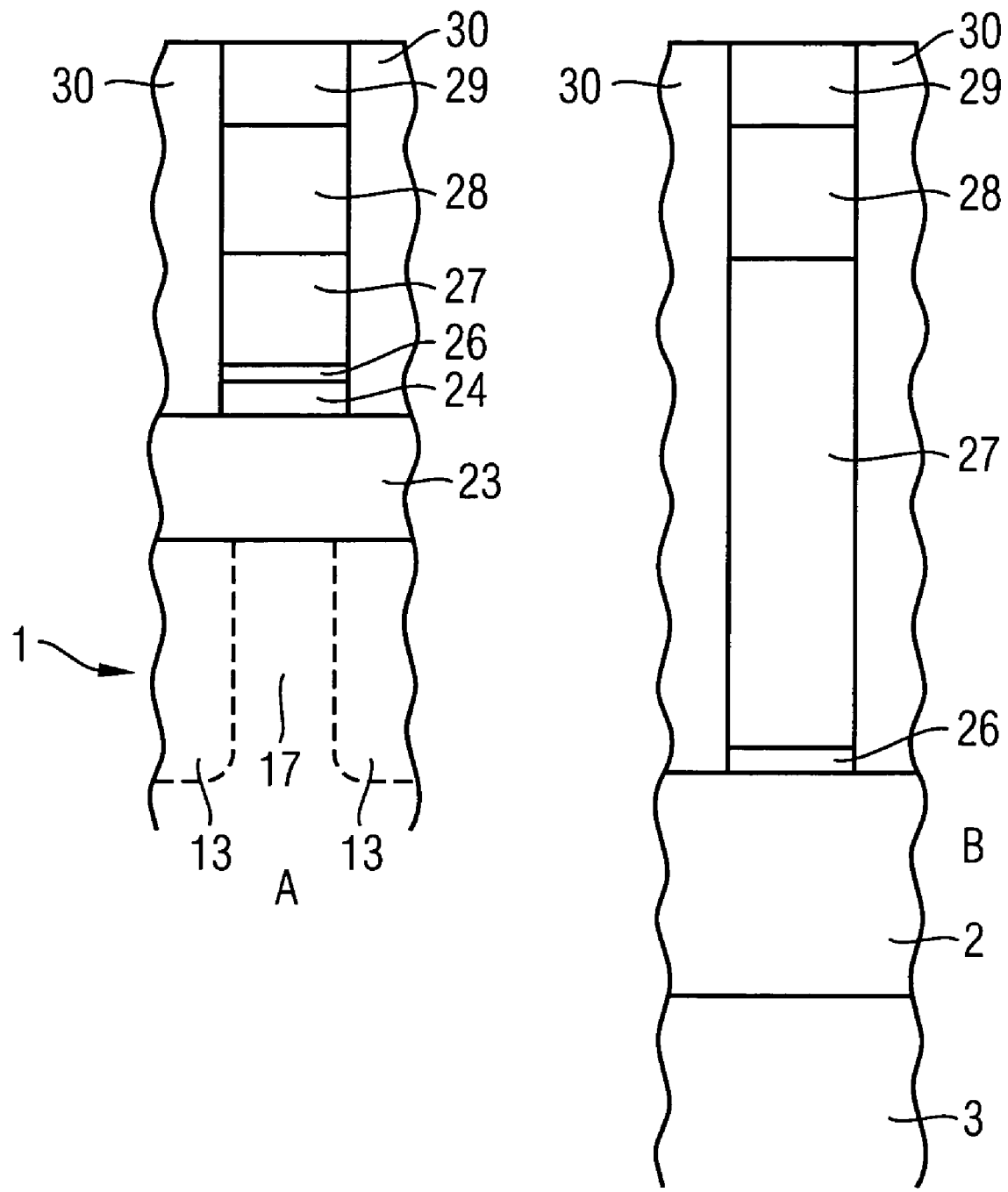

Referring now to FIGS. 3G and 3H, each of which shows a cross-sectional view along a bit line relating to arrows A and B in FIG. 3F. The gate stack including control gate layer 27 is patterned by lithography and etched by means of RIE. Etching is continued in order to remove the control gate layer 27 in the recessed portions, while taking advantage of high selectivity to oxide (FIG. 3G). Then, source-/drain junctions 13 are implanted and dielectric layers 26 are etched, which may be effected wet or with an isotropic dry-etching process. After that, etching of the floating gate layer 24 to interrupt the floating gate layer is effected wet or with an isotropic dry-etching process (FIG. 3H). Referring to FIG. 3I, which shows a cross-sectional view along a bit line relating to arrows A and B in FIG. 3F, an oxide layer 30 is deposited to fill word line gaps and to encapsulate the floating gates 24, and then is planarized by chemical-mechanical polishing.

Figure 4A:
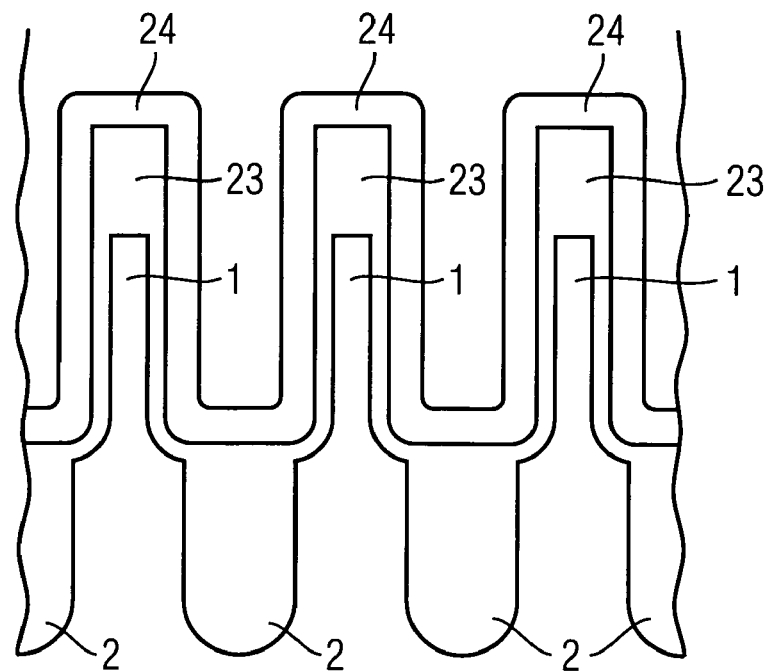
FIGS. 4A trough 4D are schematic cross-sectional views to illustrate another embodiment of a manufacturing method for producing high-density flash memory cells of FIGS. 2A and 2B.
Figure 4B:
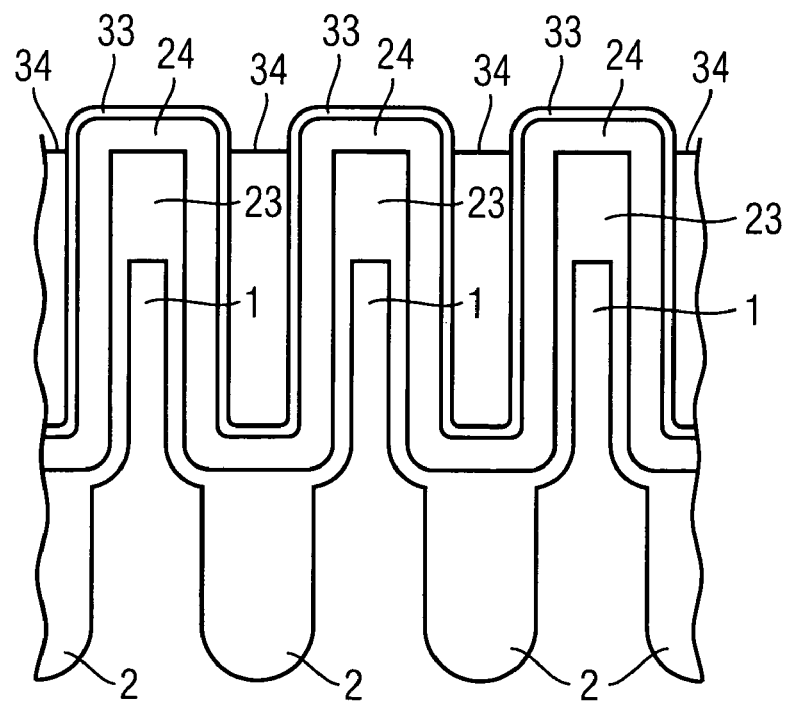
Figure 4C:
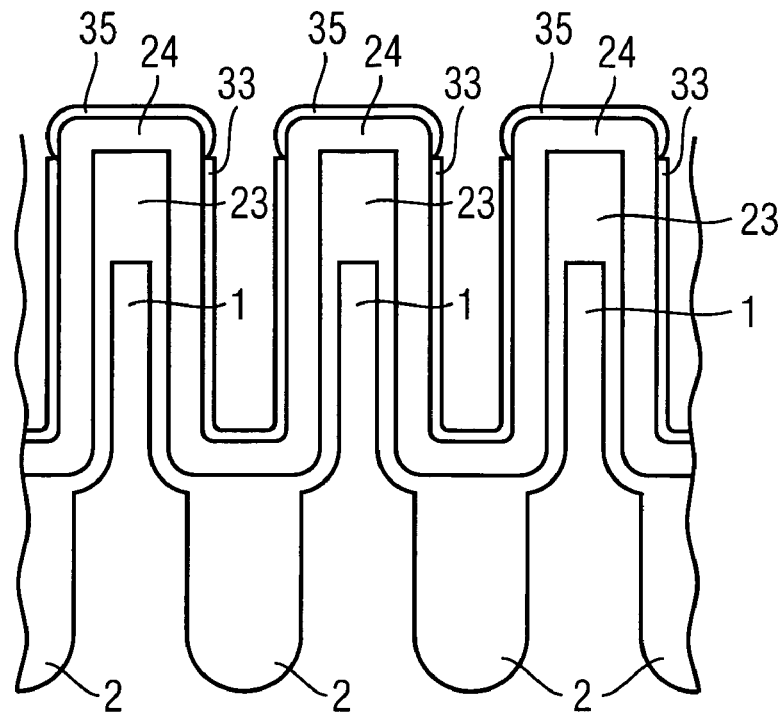
Figure 4D:
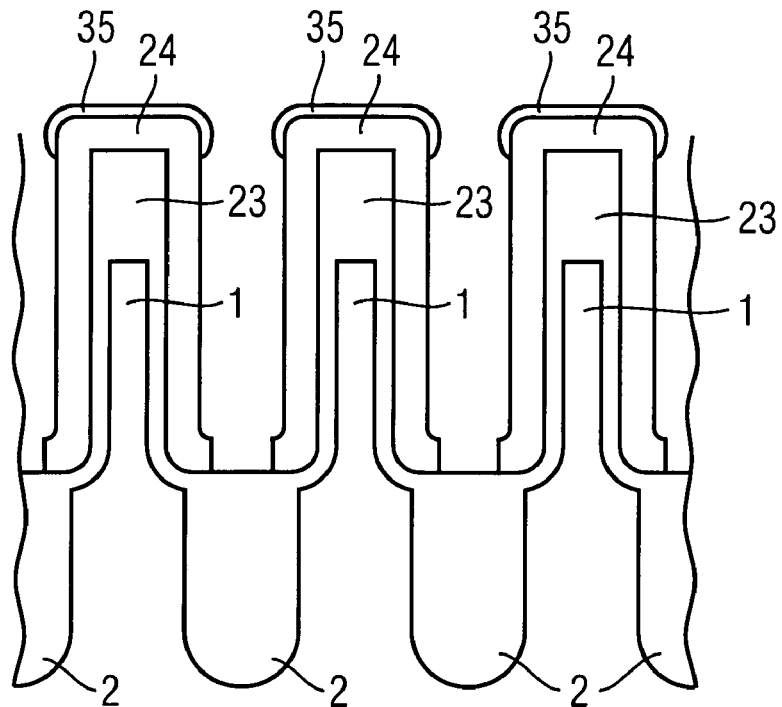

FIGS. 4A trough 4D show schematic cross-sectional views to illustrate another embodiment of a manufacturing method for producing high-density flash memory cells of FIGS. 2A and 2B. This embodiment is very similar to the first embodiment, illustrated in FIGS. 3A to 3H, and thus, in order to avoid unnecessary repetitions, only the differences between both embodiments are discussed. Firstly, steps relating to FIGS. 3A to 3C are to be effected. Then, see FIGS. 4A and 4B, a tunneling oxide layer 23 is grown and a floating gate layer 24 is deposited onto the surface of the tunneling oxide layer in using convenient CVD-techniques with conformal coating, which is different to the deposition of the floating gate layer 24 as to the first embodiment. Then, a thin nitride liner 33 is deposited and the wafer is coated with an organic layer 34 (resist), which after deposition is etched back. FIG. 4B shows a situation, in which organic layer 34 has been etched back. Then, see FIG. 4C, thin nitride liner 33 is removed, where exposed to etch chemistry, and, organic layer 34 is removed, too. After this, an oxide mask 35 is grown on the uncovered surface. Then, see FIG. 4D, the thin nitride liner 33 is removed, where it is exposed to etch chemistry, and, floating gate layer 24 is etched to interrupt floating gate layer 24 by means of RIE. Then, oxide mask 35 is removed. FIG. 4D shows a situation, in which floating gate layer 24 has been etched and before oxide mask 35 will be removed. After this, steps relating to FIGS. 3F to 3I are to be effected.

Obviously many modifications and variations of the present invention are possible in light of the above description. It is therefore to be understood, that within the scope of appended claims, the invention may be practiced otherwise than as specificially devised.

What is claimed is:

1. A flash memory cell comprising:
   a silicon substrate having an active region comprising a channel region and source-/drain-regions, the active region comprising a projecting portion, which projecting portion at least comprising said channel region;
   a tunneling dielectric layer fanned at least partly on the surface of said active region;
   a floating gate formed on the surface of said tunneling dielectric layer for storing electric charges;
   an inter-gates coupling dielectric layer formed on the surface of said floating gate, and
   a control gate formed on the surface of said inter-gates coupling dielectric layer,
   wherein said floating gate is formed to have a groove-like shape for at least partly encompassing said projecting portion of said active region, and
   wherein said projecting portion of said active region is formed to have width (W), which is in the range of from 10 nm to 30 nm.

2. The flash memory cell as claimed in claim 1, wherein said projecting portion of said active region is formed to have a height (H), which is no greater than 100 nm.

3. The flash memory device according to claim 2, wherein the height (H) is in the range of from 30 nm to 100 nm.

4. The flash memory cell as claimed in claim 1, wherein said groove-like floating electrode is formed to have a U-channel-like shape.

5. The flash memory cell as claimed in claim 4, wherein said projecting portion of said active region is formed to have a rail-like shape.

6. The flash memory cell as claimed in claim 5, wherein said floating electrode material comprises silicon.

7. The flash memory cell as claimed in claim 6, wherein said tunneling dielectric layer is selected from an oxide layer or a nitrided oxide layer.

8. The flash memory cell as claimed in claim 7, wherein said inter-gates coupling dielectric layer is comprised of a silicon oxide film, a silicon nitride film or a silicon oxide film (ONO-structure).

9. The flash memory cell as claimed in claim 8, wherein tunneling of electrons through said tunneling dielectric layer is enabled at one or both side areas of said projecting portion of said active region and is not enabled at a top area of said projecting portion of said active region.

10. The flash memory cell as claimed in claim 9, wherein a coupling area between said control gate and said floating gate is at least about 3 times as large as a coupling area between said floating gate and said active region.

11. The flash memory cell as claimed in claim 10, wherein an equivalent thickness of said inter-gates coupling dielectric layer is about 2 times as large as a thickness of said tunneling dielectric layer.

12. The flash memory cell as claimed in claim 11, wherein a thickness of said tunneling dielectric layer is about 7 nm.

13. The flash memory cell as claimed in claim 5, wherein said floating electrode material comprises Ge and an inert metallic material.

14. The flash memory cell as claimed in claim 13, wherein the inert metallic material comprises a material selected from the group consisting of TIN, TaN, WN, Ir, IrO, Ru, RuO, WSi; and combinations thereof.

15. The flash memory cell as claimed in claim 6, wherein said floating electrode material comprises n-doped silicon.

16. The flash memory cell as claimed in claim 6, wherein said floating electrode material comprises p-doped silicon.

17. A flash memory device comprising an array of programmable and erasable memory cells, the memory cells being arranged in columns and rows and being connected to a plurality of bit lines and word lines,
wherein the memory cells comprise:
a silicon substrate having an active region comprising a channel region and source-/drain-regions, the active region comprising a projecting portion, which projecting portion at least comprising said channel region;
a tunneling dielectric layer Conned at least partly on the surface of said active region;
a floating gate formed on the surface of said tunneling dielectric layer for storing electric charges;
an inter-gates coupling dielectric layer Conned on the surface of said floating gate, and
a control gate formed on the surface of said inter-gates coupling dielectric layer,
wherein said floating gate is formed to have a groove-like shape for at least partly encompassing said projecting portion of said active region,
wherein said projecting portion of said active region is formed to have width (W), which is in the range of from 10 nm to 30 nm.

18. The flash memory device according to claim 17 having a NAND-type structure comprising a plurality of bit lines, a plurality of memory cells connected to said bit lines and forming NAND cell blocks, each of which has a series array of flash memory cells connected at a first node thereof to a corresponding bit line ($BL_k$) associated therewith and connected at a second node thereof to said substrate, and parallel word lines ($WL_k$) each of which is coupled to the floating gates of one of said flash memory cells.

19. The flash memory device according to claim 17 having a NOR-type structure comprising a plurality of bit lines, a plurality of memory cells connected to said bit lines and forming NOR cell blocks, each of which has a flash memory cell connected at a first node thereof to a corresponding bit flue ($BL_k$) associated therewith and connected at a second node thereof to said substrate, and parallel word lines ($WL_k$), each of which is coupled to the floating gates of one of said flash memory cells.

20. The flash memory device according to claim 17 having a bit line pitch (F) and/or word line pitch of at most 150 nm.

21. The flash memory device according to claim 17, having a bit line half-pitch and/or word line half-pitch in the range of from 40 to 70 nm.

22. The flash memory device according to claim 17, wherein the flash memory cells being isolated from other memory cells by STI (shallow trench isolation) trenches.

23. A flash memory cell comprising:
a silicon substrate having an active region comprising a channel region and source-/drain-regions, the active region comprising a projecting portion, said projecting portion at least comprising said channel region;
a tunneling dielectric layer formed at least partly on the surface of said active region;
a floating gate formed on the surface of said tunneling dielectric layer for storing electric charges, wherein said floating gate is formed to have a groove-like shape for at least partly encompassing said projecting portion of said active region;
an inter-gates coupling dielectric layer formed on the surface of said floating gate, and
a control gate formed on the surface of said inter-gates coupling dielectric layer, wherein a coupling area between said control gate and said floating gate is at least about 3 times as large as a coupling area between said floating gate and said active region.

24. The flash memory cell as claimed in claim 23, wherein said projecting portion of said active region is formed to have width (W), which is in the range of from 10 nm to 30 nm.

25. The flash memory cell as claimed in claim 23, wherein said floating electrode material comprises silicon.

26. The flash memory cell as claimed in claim 23, wherein said floating electrode material comprises germanium Ge and an inert metallic material selected from the group consisting of TiN, TaN, WN, Ir, IrO, Ru, RuO, WSi, and combinations thereof.

27. The flash memory cell as claimed in claim 23, wherein said tunneling dielectric layer is selected from an oxide layer or a nitrided oxide layer.

28. The flash memory cell as claimed in claim 23, wherein said inter-gates coupling dielectric layer is comprised of a silicon oxide film, a silicon nitride film or a silicon oxide film (ONO-structure).

29. The flash memory cell as claimed in claim 23, wherein tunneling of electrons through said tunneling dielectric layer is enabled at one or both side areas of said projecting portion of said active region and is not enabled at a top area of said projecting portion of said active region.

30. The flash memory cell as claimed in claim 23, wherein an equivalent thickness of said inter-gates coupling dielectric layer is about 2 times as large as a thickness of said tunneling dielectric layer.

31. The flash memory cell as claimed in claim 23, wherein a thickness of said tunneling dielectric layer is about 7 nm.

* * * * *

UNITED STATES PATENT AND TRADEMARK OFFICE
CERTIFICATE OF CORRECTION

PATENT NO. : 7,087,950 B2  Page 1 of 1
APPLICATION NO. : 10/835390
DATED : August 8, 2006
INVENTOR(S) : Willer et al.

It is certified that error appears in the above-identified patent and that said Letters Patent is hereby corrected as shown below:

Column 9, line 41; delete "trough" insert --through--

Signed and Sealed this

Fourth Day of March, 2008

JON W. DUDAS
*Director of the United States Patent and Trademark Office*